United States Patent
Binder et al.

(10) Patent No.: US 10,700,534 B2
(45) Date of Patent: Jun. 30, 2020

(54) AUTOMATIC DC RESISTANCE COMPENSATION

(71) Applicant: MICROSOFT TECHNOLOGY LICENSING, LLC, Redmond, WA (US)

(72) Inventors: Julian Arlo Binder, Sunnyvale, CA (US); David Paul Wunsch Desrosiers, Los Gatos, CA (US); Eugene Lvovich Shoykhet, San Jose, CA (US); David Simon Lukofsky, San Francisco, CA (US); Agustya Ruchir Mehta, Mountain View, CA (US); Junius Mark Penny, Ben Lomond, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 156 days.

(21) Appl. No.: 15/417,532

(22) Filed: Jan. 27, 2017

(65) Prior Publication Data

US 2018/0219389 A1    Aug. 2, 2018

(51) Int. Cl.
| | |
|---|---|
| *H02J 7/00* | (2006.01) |
| *G01R 19/10* | (2006.01) |
| *G01R 19/165* | (2006.01) |
| *G01R 31/36* | (2020.01) |
| *G06F 1/26* | (2006.01) |
| *G01R 31/396* | (2019.01) |

(Continued)

(52) U.S. Cl.
CPC .......... *H02J 7/0021* (2013.01); *G01R 19/10* (2013.01); *G01R 19/16571* (2013.01);
(Continued)

(58) Field of Classification Search
CPC .............. G01R 19/10; G01R 19/16571; G01R 31/3658; G02B 27/017; G06F 1/163;
(Continued)

(56) References Cited

U.S. PATENT DOCUMENTS 5,808,444 A * 9/1998 Saeki ................. H02J 7/0071
                                                                                      320/117
6,700,427 B1    3/2004 Sherman
(Continued)

FOREIGN PATENT DOCUMENTS

| CA | 2585894 A1 | 10/2007 |
| CN | 101926025 A | 12/2010 |

(Continued)

OTHER PUBLICATIONS

Zhang, et al., "Compensation for supply and motor unbalances and line resistance for a DC signal injection-based thermal protection method", In Proceedings of IEEE 6th International Power Electronics and Motion Control Conference, May 17, 2009, pp. 855-859.

(Continued)

*Primary Examiner* — Rexford N Barnie
*Assistant Examiner* — Elim Ortiz
(74) *Attorney, Agent, or Firm* — Shook, Hardy & Bacon, LLP

(57) ABSTRACT

The uneven charge and discharge from non-collocated batteries within an HMD can be solved by monitoring the DC current on the paths coupled to the first battery and the second battery and making an adjustment in the path resistance to equalize, or at least reduce, the difference between the currents on the two paths. Aspects of the technology described herein monitor current on paths from two or more non-collocated batteries. When the currents are different, resistance is dynamically added to the path with the higher current to equalize the current in the two paths. The monitoring and resistance adjustment can occur during discharge from a battery to a load and during battery recharge.

20 Claims, 9 Drawing Sheets

(51) Int. Cl.
*G02B 27/01* (2006.01)
*H02J 7/34* (2006.01)
*H02J 1/10* (2006.01)
*G06F 1/16* (2006.01)

(52) U.S. Cl.
CPC ......... *G01R 31/396* (2019.01); *G02B 27/017* (2013.01); *G06F 1/26* (2013.01); *H02J 1/108* (2013.01); *H02J 7/0013* (2013.01); *H02J 7/34* (2013.01); *G06F 1/163* (2013.01)

(58) Field of Classification Search
CPC ... G06F 1/26; H02J 1/10; H02J 7/0013; H02J 7/0021; H02J 7/0068; H02J 7/0072; H02J 7/34
See application file for complete search history.

(56) References Cited

U.S. PATENT DOCUMENTS

| | | | |
|---|---|---|---|
| 6,801,016 B2 | 10/2004 | Davis et al. | |
| 8,541,979 B2 | 9/2013 | Firehammer et al. | |
| 9,101,175 B2 | 8/2015 | Redpath et al. | |
| 9,151,817 B1 | 10/2015 | Lakshmikanthan et al. | |
| 9,176,197 B2 | 11/2015 | Chandler et al. | |
| 2008/0309547 A1* | 12/2008 | Michalski | G01S 13/0209 342/137 |
| 2009/0309547 A1 | 12/2009 | Nakatsuji | |
| 2014/0125284 A1 | 5/2014 | Qahouq | |
| 2014/0145684 A1 | 5/2014 | Liu et al. | |
| 2016/0291666 A1* | 10/2016 | Hosoya | G06F 9/453 |
| 2017/0141589 A1* | 5/2017 | Inoue | H02J 7/1423 |

FOREIGN PATENT DOCUMENTS

| WO | 2014018048 A1 | 1/2014 |
|---|---|---|
| WO | 2016002485 A1 | 1/2016 |
| WO | 2016009389 A1 | 1/2016 |

OTHER PUBLICATIONS

"International Search Report and Written Opinion Issued in PCT Application No. PCT/US2018/014301", dated Apr. 13, 2018, 12 Pages.

* cited by examiner

AUTOMATIC DC RESISTANCE COMPENSATION

BACKGROUND

In a head-mounted display (HMD), battery packs can be non-collocated. For example, to provide balance, a first battery pack could be located on the right side of an HMD and a second battery pack located on the left side of the HMD. This arrangement helps provide an equal amount of weight on both sides of the user's head. If the batteries, which are one of the heavier components in an HMD, are collocated on only one side of a device then the device may feel uncomfortable to the user. The different locations of the batteries mean the batteries can be exposed to different system conditions and environmental conditions that affect battery operation. These conditions can cause one battery or both batteries to age more quickly than they otherwise would.

SUMMARY

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

In a head-mounted display (HMD), battery packs are often located apart from each other within the device. For example, to provide balance, a first battery pack could be located on the right side of an HMD and a second battery pack located on the left side of the HMD. Most other computing devices have only a single battery or collocate multiple batteries, and are therefore unlikely to experience the technical performance challenges created when batteries are separated from each other within an HMD. Without a system to equalize current in different paths, charge and discharge will be uneven leading to shorter system run time and shorter cell lifetime, among other possible problems.

The uneven charge and discharge from non-collocated batteries within an HMD can be solved by monitoring the DC current on the paths coupled to the first battery and the second battery and making an adjustment in the path resistance to equalize, or at least reduce, the difference between the currents on the two paths. Aspects of the technology described herein monitor current on paths from two or more non-collocated batteries. When the currents are different, resistance is dynamically added to the path with the higher current to equalize the current in the two paths. The monitoring and resistance adjustment can occur during discharge from a battery to a load and during battery recharge.

Aspects of the technology described herein are not limited to two different batteries. Paths between three, four, or more non-collocated batteries can be monitored and adjusted in the same way.

BRIEF DESCRIPTION OF THE DRAWINGS

The present invention is described in detail below with reference to the attached drawing figures, wherein.

DETAILED DESCRIPTION

Figure 1:
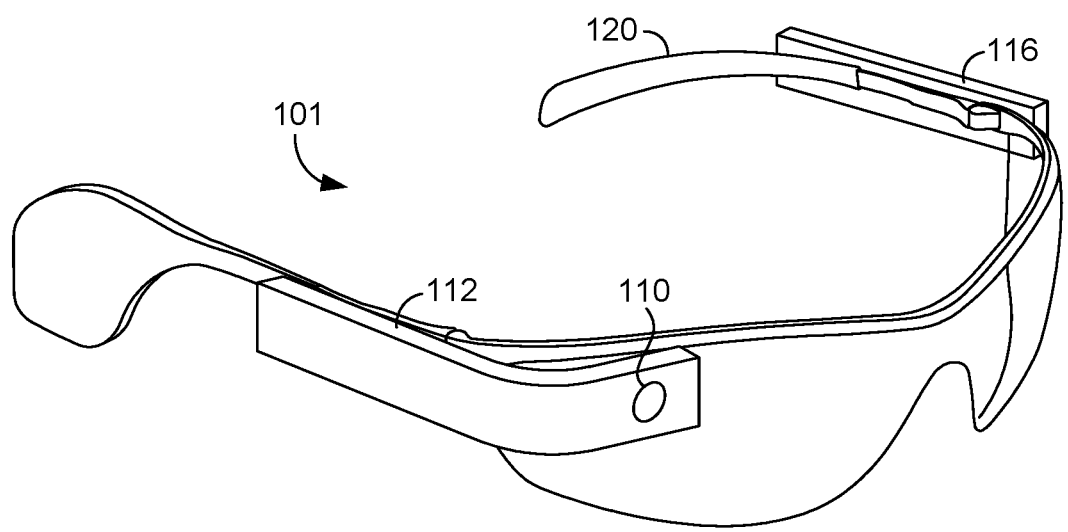
FIG. 1 shows an exemplary head-mounted display unit, in accordance with embodiments of the present invention.

The subject matter of embodiments of the invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

In a head-mounted display (HMD), battery packs are often located apart from each other within the device. For example, to provide balance, a first battery pack could be located on the right side of an HMD and a second battery pack located on the left side of the HMD. Most other computing devices have only a single battery or collocate multiple batteries, and are therefore unlikely to experience the technical performance challenges created when batteries are separated from each other within an HMD.

The separate battery pack locations present a challenge matching the DC resistance (DCR) of the interconnect, such that uniform discharge and charge paths are maintained between the multiple battery packs. Both system and environmental factors can affect the resistance within a discharge or charge path, described simply as a path herein. System factors include proximity to heat emitting components within the HMD, internal resistance within the battery, and a length of a path. Heat can cause a decrease in battery performance. A hot battery may produce less current. Processing may occur on only one side of the device, meaning the path from a first battery pack located on the same side as the load will be shorter than the path from the battery located on the other side of the HMD. A longer path to a load (e.g., a processor) can have more resistance than a shorter path, reducing the current on the longer path.

Environmental factors, such as increased heat transfer to a battery or away from a battery, can alter performance. For example, a user may be sitting in such a way that the sun shines on just one side of an HMD, and therefore on just one of two batteries. The heat transferred from the sun to just one of the batteries may cause a decreased performance for that one battery. Conversely, one side may be exposed to a source of cooling, such as moving air from an air conditioning vent that will cause differential cooling. The cooling could increase the performance of one battery over the other. The DCR of each battery pack varies with temperature and non-collocated cells can exhibit large temperature discrepancies. Without a system to equalize current in different paths, charge and discharge will be uneven leading to shorter system run time and shorter cell lifetime, among other possible problems. Unbalanced current into and out of two or more batteries can cause batteries to cycle unevenly and, therefore, age unevenly. As batteries age, the internal resistance can change causing further current discrepancies.

The uneven charge and discharge from non-collocated batteries within an HMD can be solved by monitoring the DC current on the paths coupled to the first battery and the second battery and making an adjustment in the path resistance to equalize, or at least reduce, the difference between the currents on the two paths. Aspects of the technology described herein are not limited to two different batteries. Paths between three, four, or more non-collocated batteries can be monitored and corrected in the same way. The monitoring and resistance adjustment can occur during discharge from a battery to a load and during battery recharge. As used herein, current means DC current, which can be measured in amperes.

With reference to FIG. 1, aspects of one example of an HMD (e.g., smart glasses) are illustratively provided and referred to generally herein as smart glasses 101. In various embodiments, smart glasses 101 may be embodied as a wearable computer with an optical-head-mounted display, transparent heads-up display, virtual retinal display, or other display capable of providing augmented-reality overlay and digital images as well as allowing the user to see portions of their surrounding environment. It should be noted, though not shown, that an HMD can also take the form of a virtual reality headset.

The example embodiment of smart glasses 101 shown in FIG. 1 includes a frame 120 configured to be wearable on the head of a user 160 and to support a camera 110 and display component. Smart glasses 101 include camera 110 configured to capture visual information about objects or persons viewed using smart glasses 101, and display component for displaying digital images, such as user interface features, menus, application information, or metadata associated with real objects viewed by the user-wearer and for providing augmented-reality overlay onto objects viewed by the user-wearer. Smart glasses 101 may also include other components, such as a computer and power supply and a communications component for communicating over a network (such as the Internet). The smart glasses 101 include two component housings. The right (from the perspective of the user wearing the glasses 101) component housing 112 can include a first battery, among other components not shown. The left component housing 116 can include a second battery, along with other components not shown.

Figure 2:
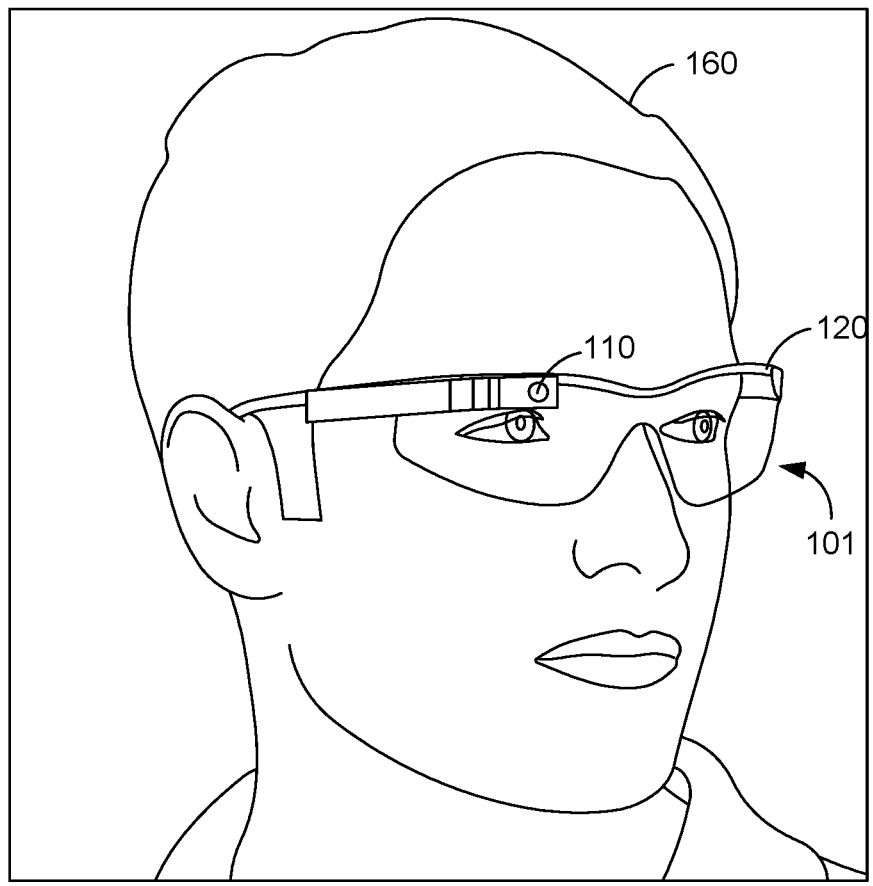
FIG. 2 shows an exemplary head-mounted display unit worn by a person, in accordance with embodiments of the present invention.

As shown in FIG. 2, as used herein, the head-mounted display includes any device 101 wearable by a person on his or her head 160 that includes a computer display. It is contemplated that these terms include embodiments implemented using smart contact lenses, direct retinal projection, heads-up type display systems, or any display system capable of providing augmented-reality imagery or virtual reality imagery.

Figure 3:
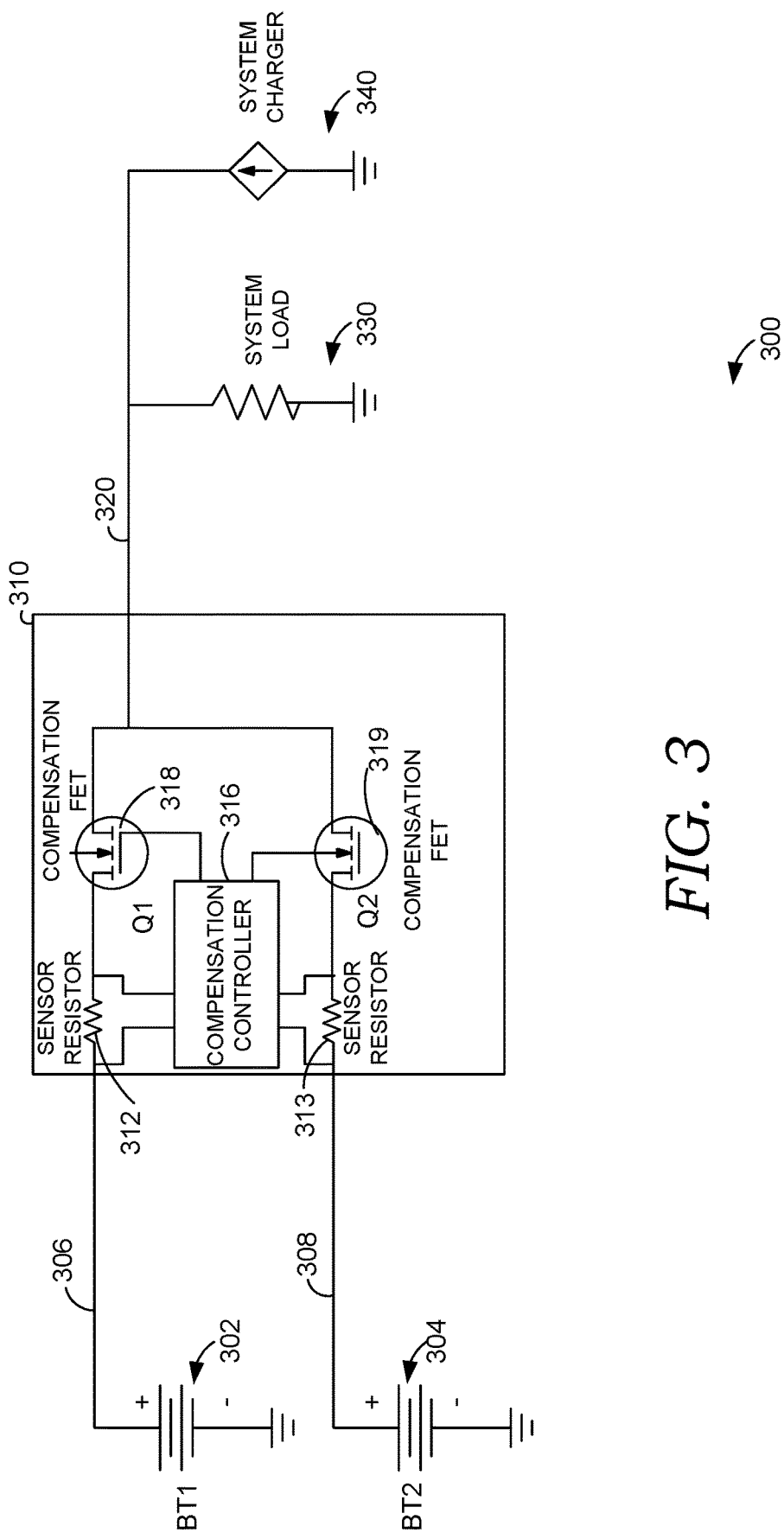
FIG. 3 is a circuit diagram showing an architecture of the DC compensation system, in accordance with embodiments of the present invention.

Turning now to FIG. 3, a circuit diagram 300 of an HMD that includes a current compensation system is shown, according to aspects of the present technology. The diagram shows a first battery 302 coupled to a first path 306 serving a load 330. The diagram also shows a second battery 304 coupled to a second path 308 serving the load 330. A current compensation controller 310 is coupled to both the first path 306 and the second path 308 before the first path 306 and the second path 308 join to form a combined path 320 that connects to the load 330. The current compensation controller 310 comprises a first current sensor 312 coupled to the first path 306, a second current sensor 313 coupled to the second path 308, a first dynamic resistor 318 coupled to the first path 306, and a second dynamic resistor 319 coupled to the second path 308. The compensation controller 310 also comprises a control processor 316 that is coupled to the first current sensor 312, the second current sensor 313, the first dynamic resistor 318, and the second dynamic resistor 319. The diagram 300 also includes a system charger 340 that transfers power to the first battery 302 and the second battery 304. The compensation controller 310 can regulate the current during battery discharge to the load 330 or charging from the system charger 340. Though not shown, a path (or paths) connect(s) the system load 330 and system charger 340 to the negative side of battery 302 and battery 304 to complete the circuit.

The first battery 302 and the second battery 304 simultaneously provide power to the HMD. In other words, both are primary sources of power. In an aspect, neither the first battery 302 nor the second battery 304 are a back-up power supply. Additionally, the first battery 302 and the second battery 304 are each located in different parts of the HMD and are not collocated. In other words, the first battery 302 and the second battery 304 are not adjacent to each other. In one aspect, the first battery 302 is located on a first side of the HMD (e.g., the right side) and the second battery 304 is located on the side opposite (e.g., the left side).

The first battery 302 and the second battery 304 can comprise any battery technology suitable for portable computing devices. The batteries can be rechargeable or single use. Exemplary battery technologies include Nickel Cadmium (NiCd), Nickel-Metal Hydride (NiMH), Lithium Ion (Li-ion), Lithium Ion Polymer (Li-ion polymer), Alkaline and Carbon Zinc, Lithium, Silver Oxide, Mercury, and Zinc Air.

The first current sensor 312 and the second current sensor 313 detect electric current (DC) in a wire, and generates a signal that describes the current. The generated signal could be unipolar, which duplicates the wave shape of the sensed current. The generated signal could be a digital output, which switches when the sensed current exceeds a certain threshold. Exemplary sensor types include a sensing resistor. The current sensor generates a voltage signal, which is representative of the current flowing at the sensor 312 and 313. Alternatively, the current sensor could generate a proportional current signal to indicate the measured current.

The first dynamic resistor 318 and the second dynamic resistor 319 respond to a signal from the control processor 316 and add an instructed amount of resistance to the path. The dynamic resistor can be a field-effect transistor (FET).

The control processor 316 receives a signal from each of the sensors 312 and 313. The signals are compared to determine a difference in current between the first path 306 and the second path 308. The signal may be compared directly, for example, based on the voltage of each signal or converted to a traditional current measure, such as amps, before comparison. Either way, the voltage of the signal (in contrast to the voltage of the paths) or amps represents a current in the paths. If the difference exceeds a threshold, then an instruction can be generated and communicated to either the first dynamic resistor 318 or the second dynamic resistor 319 to add resistance to the path with the higher current. The signal can be calculated to provide the correct amount of resistance to balance the currents in the first path 306 and the second path 308. Alternatively, an iterative approach can be used where the resistance is increased in steps until new signals are received from the sensors that indicate the current in the two paths is within the threshold difference. In one aspect, the control processor is a microcontroller.

Figure 4:
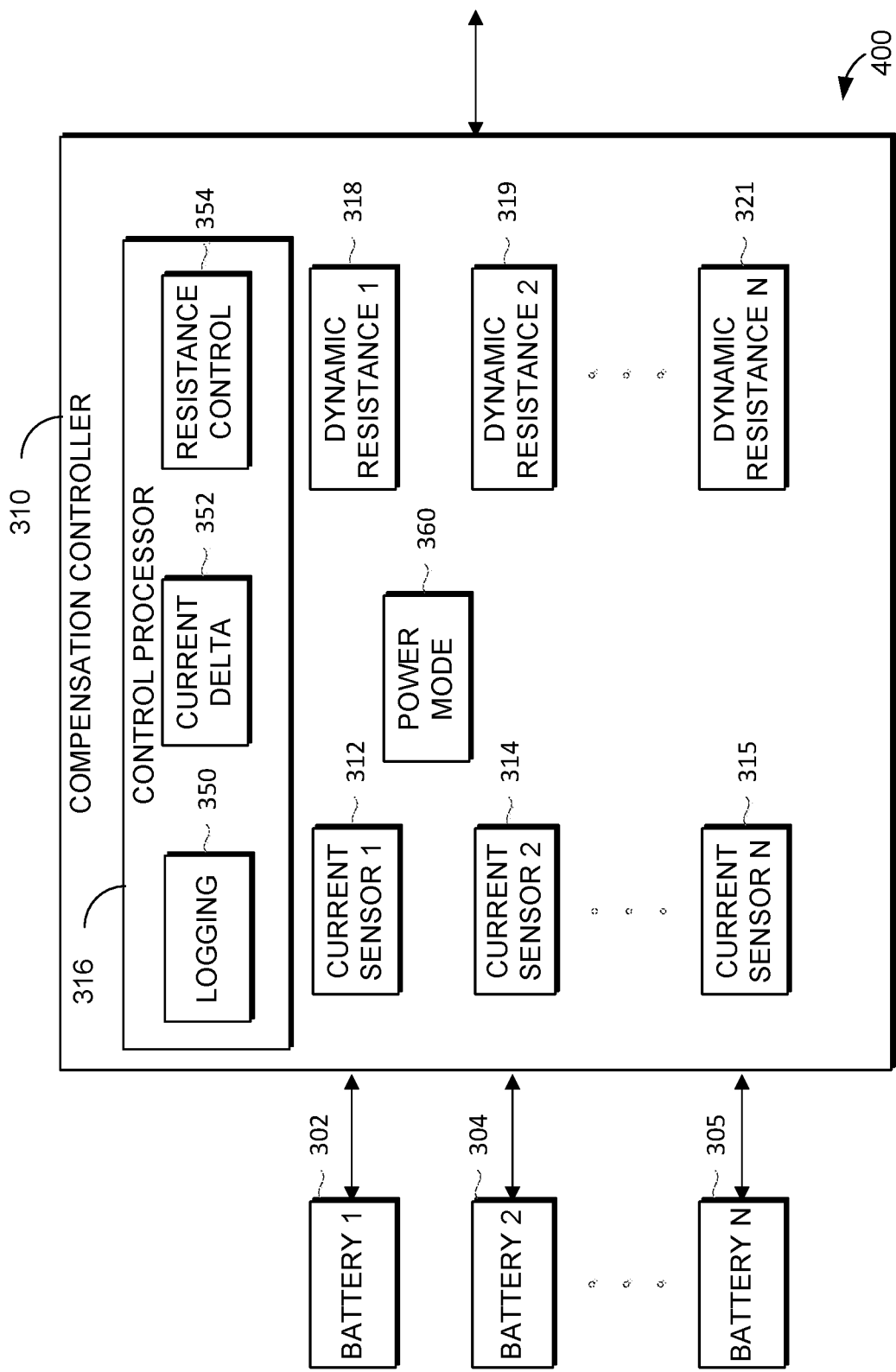
FIG. 4 is a system diagram of the DC compensation system, in accordance with embodiments of the present invention.

Turning to FIG. 4, a system diagram 400 of the compensation controller 310 is shown, according to an aspect of the present invention. Many of the aspects of system diagram 400 have been described previously with reference to FIG. 3. For example, the first battery 302 and the second battery 304 have been described previously. System diagram 400 includes an Nth battery 305 indicating that the technology described herein works with more than two non-collocated batteries. In similar fashion, Nth sensor 315 and Nth dynamic resistance component 321 are shown. In all uses, N could be an integer equal to three or greater.

The control processor 316 includes a logging component 350, a current delta component 352, and a resistance controller 354. The logging component 350 can generate the records of various measurements and calculations within the HMD and save the records in a data store. These records can then be used to gauge battery performance over time. The logging component 350 can log raw signals received from the sensors, differences between the currents calculated by the current delta component 352, and resistance instructions provided by the resistance controller 354. Each record can be associated with a time.

The current delta component 352 receives signals from the current sensors. The current delta component 352 can convert the signals or compare the raw signals. For example, if the raw signals communicated voltage that corresponds to the measured current in the paths, then the voltage of the respective signals could be compared. Adjustments and resistance could then be made until the voltage of the respective signals falls into an acceptable operating range. In another example, the raw signals could be converted to amps and then compared. When a difference in current is detected by the current delta component 352, then an instruction can be communicated to the resistance controller 354 to lower the current in one of the paths (or multiple paths if more than two) by increasing resistance in that path(s).

The resistance controller 354 generates a signal or instruction that is routed to a dynamic resistance component. The signal or instruction includes a specified amount of resistance to be added.

The power mode control 360 can set the power mode for the compensation controller 310. The power mode can change based on available charge in the batteries. The instruction to change the power mode can be received by the power mode control 360 from another component, such as an operating system for the HMD or some other power management component. The power mode control 360 can also monitor the battery charge and adjust the power mode of the compensation controller 310 based on the battery charge. The power mode control 360 can include a set of rules that adjust the power mode (e.g., normal, low, ultra-low, standby) of the compensation controller 310 as the available charge in the battery decreases. For example, the compensation controller 310 could enter a low power mode at 20% charge, ultra-low power mode at 10% charge, and shut down or go on standby at 5% charge. Other thresholds are possible. Also, several different power modes are possible, not just the three described above.

In a low power mode, the sensors (e.g., first current sensor 312, second current sensor 312) can take measurements less frequently. For example, the sensors could take measurements 50% less frequently than in normal power mode, 75% less frequently than in normal power mode, 90% less frequently than in normal power mode, 99% less frequently than in normal power mode, or some other frequency reduction. Additionally, the compensation controller 310 can stop instructing the dynamic resistance components to adjust resistance. In one low power mode, the current sensing does not change, but dynamic resistance is no longer provided. In another lower power mode, the current sensing decreases and the dynamic resistance is no longer provided. Once the battery charge increases, the compensation controller can be moved to a power mode consistent with the increased charge.

Figure 5:
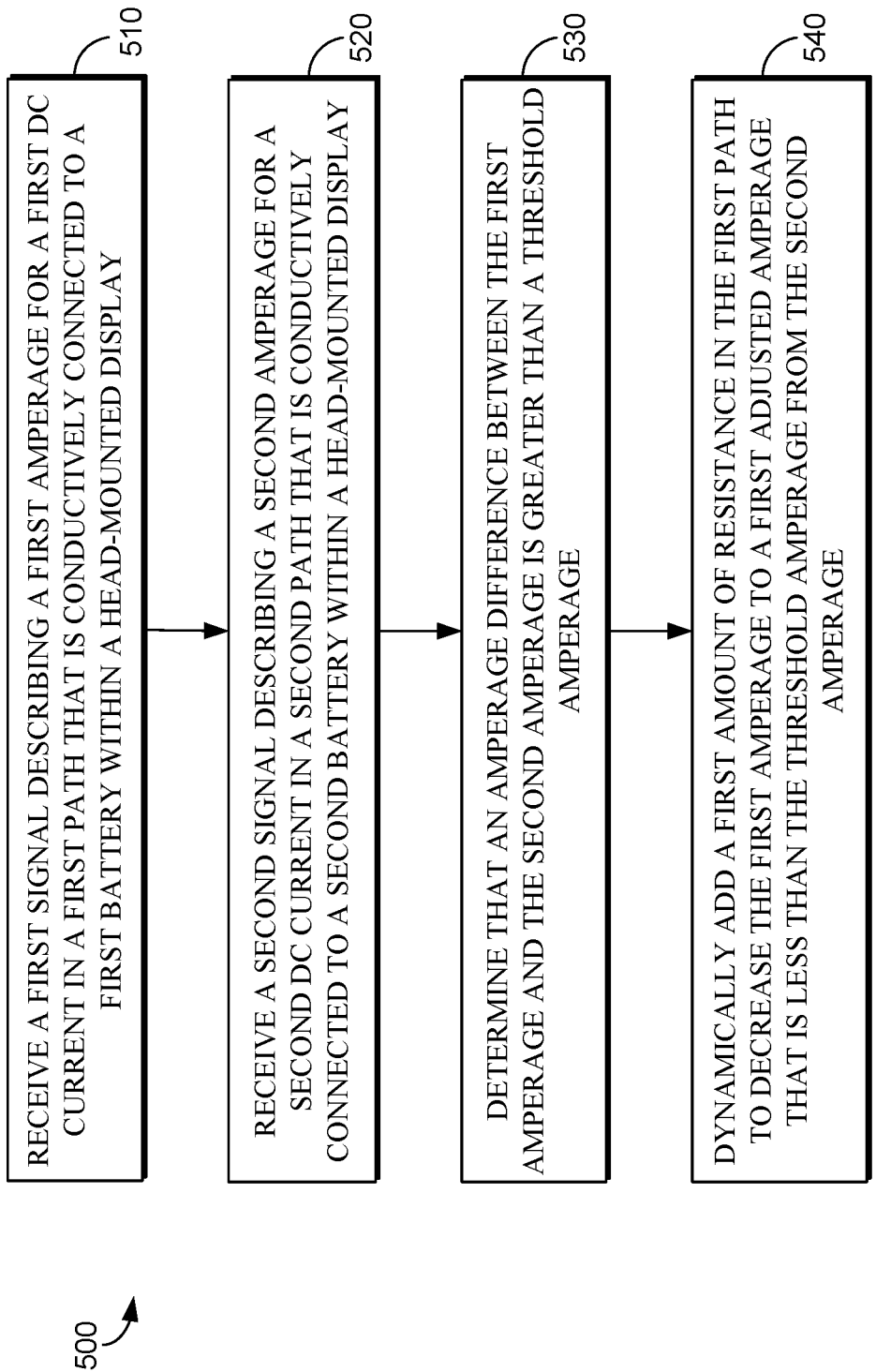
FIG. 5 is a flow chart showing a method for regulating DC current received from two or more non-collocated batteries within a head-mounted display, in accordance with embodiments of the present invention.

Turning now to FIG. 5, a method 500 for regulating DC current received from two or more non-collocated batteries within a head-mounted display is shown, according to aspects of the technology described herein. Method 500 can be performed by a compensation controller, such as is described previously with reference to FIGS. 3 and 4.

At step 510, a first signal is received. The first signal describes a first amperage for a first DC current in a first path that is conductively connected to a first battery within the head-mounted display. In one aspect, the signal is received from a sensor resistor and the voltage of the signal corresponds to the first amperage.

At step 520, a second signal is received. The second signal describes a second amperage for a second DC current in a second path that is conductively connected to a second battery within a head-mounted display. In one aspect, the signal is received from a sensor resistor and the voltage of the second signal corresponds to the second amperage.

At step 530, the amperage difference between the first amperage and the second amperage is determined to be greater than a threshold amperage. Though the difference is described in terms of amperage, it is not necessary to actually calculate the amperage of each current in order for the difference to exceed the threshold. As mentioned, an aspect of the signals, such as voltage, could be compared to determine whether the difference in the two currents exceeds the threshold without converting the signal to amperage.

At step 540, a first amount of resistance is dynamically added in the first path to decrease the first amperage to a first adjusted amperage that is less than the threshold amperage difference from the second amperage. Resistance is added to the first path because the first path was previously determined to have a higher current. Adding resistance to the first path will lower the current of the first path to close the difference between the currents in the first path and the second path to below the threshold difference. In one aspect, the threshold difference can be zero. In other words, resistance is added until the currents are exactly equal.

Figure 6:
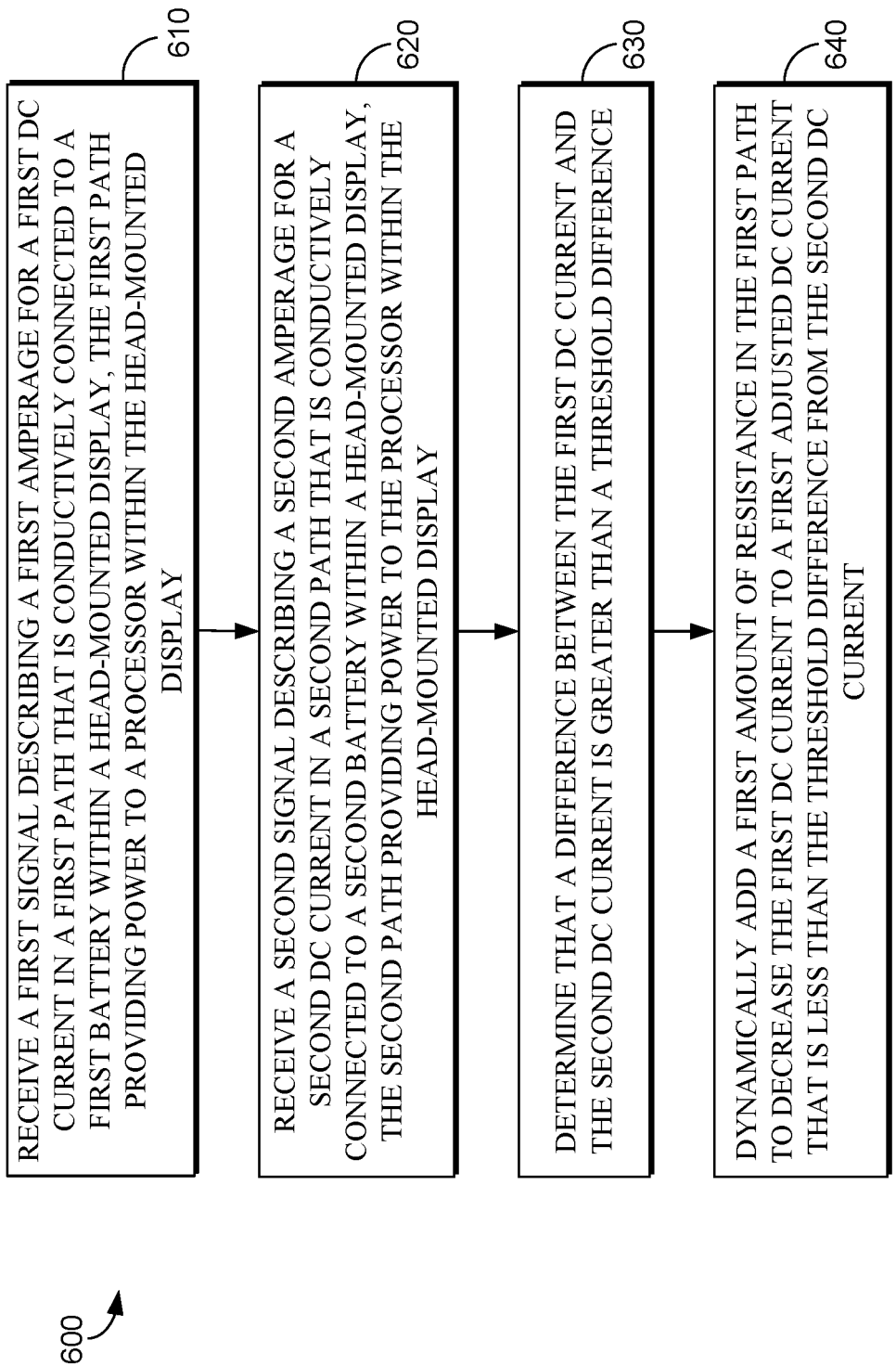
FIG. 6 is a flow chart showing a method for regulating DC current received from two or more non-collocated batteries within a head-mounted display, in accordance with embodiments of the present invention.

Turning now to FIG. 6, a method 600 for regulating DC current received from two or more non-collocated batteries within a head-mounted display is shown, according to aspects of the technology described herein. Method 600 can be performed by a compensation controller, such as is described previously with reference to FIGS. 3 and 4.

At step 610, a first signal is received. The first signal describes a first amperage for a first DC current in a first path that is conductively connected to a first battery within a head-mounted display. The first path provides power to a processor within the head-mounted display.

At step 620, a second signal is received. The second signal describes a second amperage for a second DC current in a second path that is conductively connected to a second battery within a head-mounted display. The second path provides power to the processor within the head-mounted display.

At step 630, a difference between the first DC current and the second DC current is determined to be greater than a threshold difference. The first path is determined to have a greater current than the second path.

At step 640, a first amount of resistance is added in the first path to decrease the first DC current to a first adjusted DC current that is less than the threshold difference from the second amperage.

Figure 7:
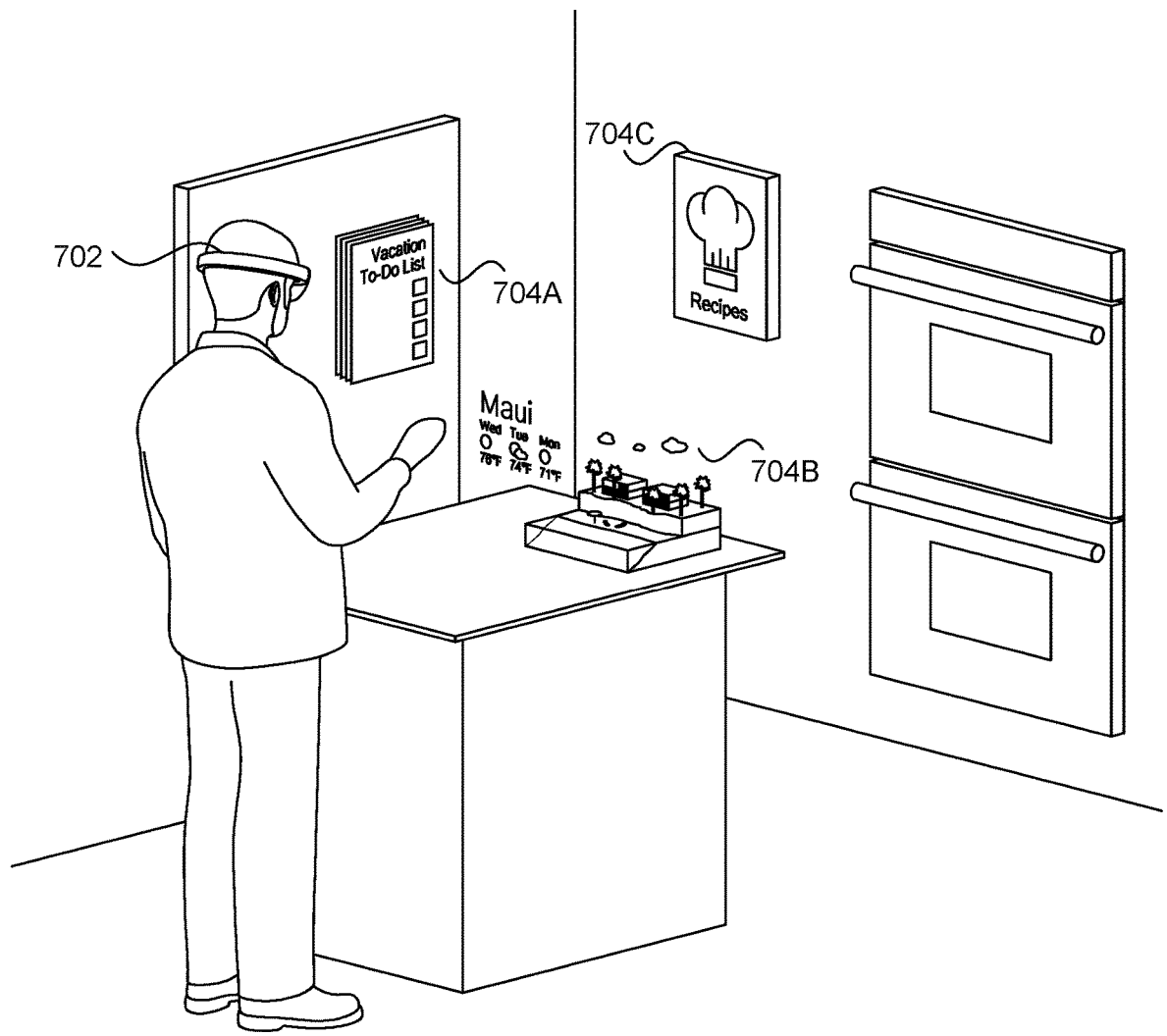
FIG. 7 is a schematic diagram showing exemplary augmented-reality images of a head-mounted display unit, in accordance with embodiments of the present invention.

With reference to FIG. 7, exemplary images of a head-mounted display (HMD) device 702 are depicted. Augmented-reality images (e.g., 704A, 704B, and 704C), provided by the HMD device, generally appear superimposed on a background and may appear to interact with or be integral with the background. The background is comprised of a real world scene, e.g., a scene that a user would perceive without augmented-reality images emitted by the HMD device. For example, the recipe book icon 704C can appear superimposed and hanging in mid-air in front of the cooking oven or wall.

Figure 8:
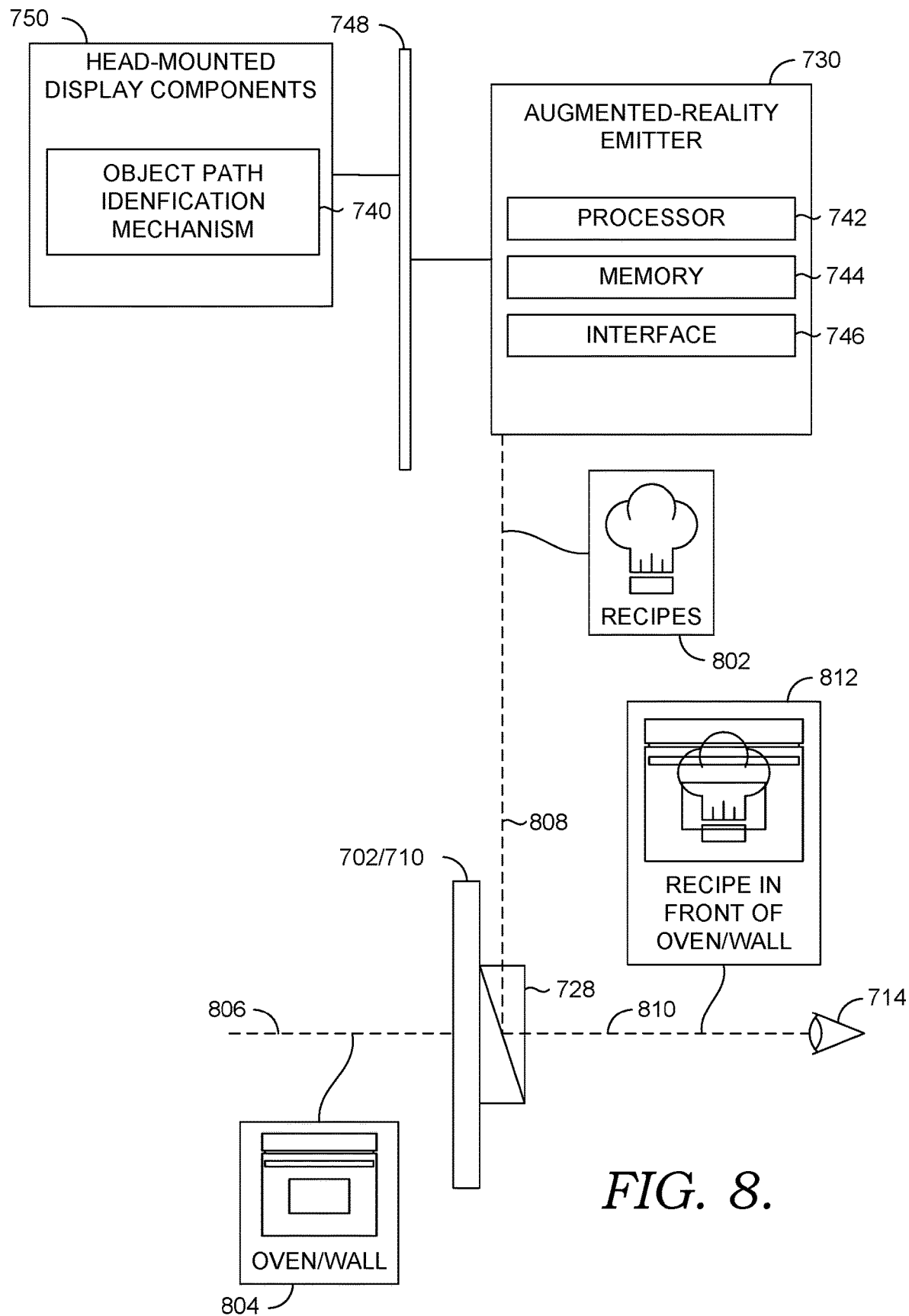
FIG. 8 is a block diagram of an exemplary head-mounted display unit, in accordance with embodiments of the present invention.

Turning to FIG. 8, the HMD device 702 having the object path identification mechanism 740 is described in accordance with an embodiment described herein. The HMD device 702 includes a see-through lens 710 which is placed in front of a user's eye 714, similar to an eyeglass lens. It is contemplated that a pair of see-through lenses 710 can be provided, one for each eye 714. The lens 710 includes an optical display component 728, such as a beam splitter (e.g., a half-silvered mirror). The HMD device 702 includes an augmented-reality emitter 730 that facilitates altering the brightness of augmented-reality images. Amongst other components not shown, the HMD device also includes a processor 742, memory 744, interface 746, a bus 748, and additional HMD components 750. The augmented-reality emitter 730 emits light representing an augmented-reality image 802 exemplified by a light ray 808. Light from the real world scene 804, such as a light ray 806, reaches the lens 710. Additional optics can be used to refocus the augmented-reality image 802 so that it appears to originate from several feet away from the eye 714 rather than one inch away, where the display component 728 actually is. The memory 744 can contain instructions which are executed by the processor 742 to enable the augmented-reality emitter 730 to perform functions as described. One or more of the processors can be considered to be control circuits. The augmented-reality emitter 730 communicates with the additional HMD components 750 using the bus 748 and other suitable communication paths.

Other arrangements and elements (e.g., machines, interfaces, functions, orders, and groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

The augmented-reality image 802 is reflected by the display component 728 toward a user's eye, as exemplified by a light ray 810, so that the user sees an image 812. In the image 812, a portion of the real world scene 804, such as a cooking oven, is visible along with the entire augmented-reality image 802, such as a recipe book icon. The user can therefore see a mixed-reality image 812 in which the recipe book icon is hanging in front of the cooking oven in this example.

Figure 9:
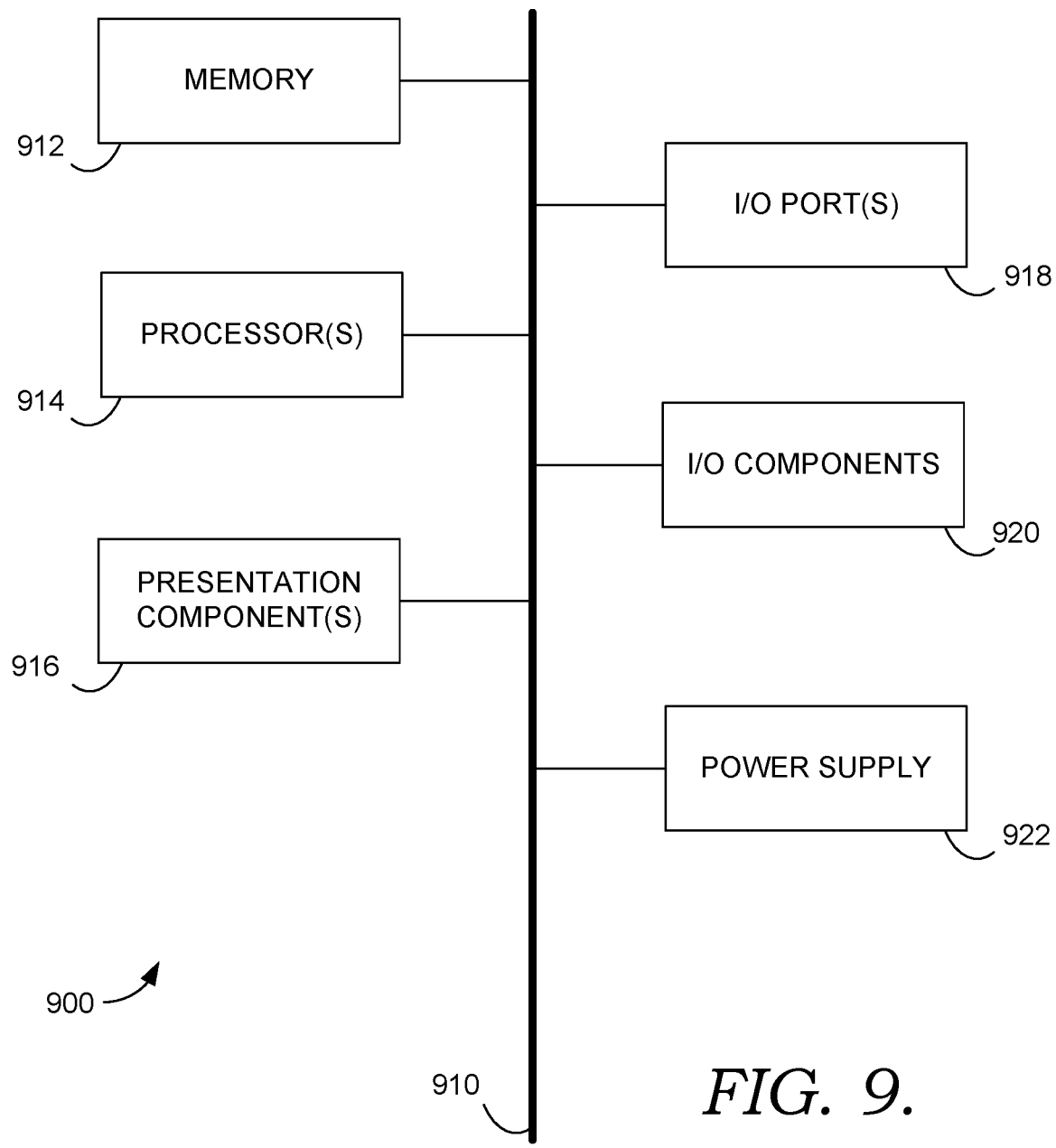
FIG. 9 is a block diagram of an exemplary computing environment suitable for use in implementing embodiments of the present invention.

Having described embodiments of the present invention, an exemplary operating environment in which embodiments of the present invention may be implemented is described below in order to provide a general context for various aspects of the present invention. Referring initially to FIG. 9 in particular, an exemplary operating environment for implementing embodiments of the present invention is shown and designated generally as computing device 900. Computing device 900 is but one example of a suitable computing environment and is not intended to suggest any limitation as to the scope of use or functionality of the invention. Neither should the computing device 900 be interpreted as having any dependency or requirement relating to any one or combination of components illustrated.

The invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The invention may be practiced in a variety of system configurations, including handheld devices, consumer electronics, general-purpose computers, more specialty computing devices, etc. The invention may also be practiced in distributed computing environments where tasks are performed by remote-processing devices that are linked through a communications network.

With reference to FIG. 9, computing device 900 includes a bus 910 that directly or indirectly couples the following devices: memory 912, one or more processors 914, one or more presentation components 916, input/output (I/O) ports 918, I/O components 920, and an illustrative power supply 922. Bus 910 represents what may be one or more busses (such as an address bus, data bus, or combination thereof). Although the various blocks of FIG. 9 are shown with paths for the sake of clarity, in reality, depathating various components is not so clear, and metaphorically, the paths would more accurately be grey and fuzzy. For example, one may consider a presentation component such as a display device to be an I/O component. Also, processors have memory. We recognize that such is the nature of the art, and reiterate that the diagram of FIG. 9 is merely illustrative of an exemplary computing device that can be used in connection with one or more embodiments of the present invention. Distinction is not made between such categories as "workstation," "server," "laptop," "handheld device," etc., as all are contemplated within the scope of FIG. 9 and reference to "computing device."

Computing device 900 typically includes a variety of computer-readable media. Computer-readable media can be any available media that can be accessed by computing device 900 and includes both volatile and nonvolatile, removable and non-removable media. By way of example, and not limitation, computer-readable media may comprise computer storage media and communication media.

Computer storage media includes volatile and nonvolatile, removable and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 900. Computer storage media excludes signals per se.

Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer-readable media.

Memory 912 includes computer storage media in the form of volatile and/or nonvolatile memory. The memory may be removable, non-removable, or a combination thereof. Exemplary hardware devices include solid-state memory, hard drives, optical-disc drives, etc. Computing device 900 includes one or more processors that read data from various entities such as memory 912 or I/O components 920. Presentation component(s) 916 present data indications to a user or other device. Exemplary presentation components include a display device, speaker, printing component, vibrating component, etc.

I/O ports 918 allow computing device 900 to be logically coupled to other devices including I/O components 920, some of which may be built in. Illustrative components include a microphone, joystick, game pad, satellite dish, scanner, printer, wireless device, etc.

For purposes of this disclosure, the word "including" has the same broad meaning as the word "comprising," and the word "accessing" comprises "receiving," "referencing," or "retrieving." In addition, words such as "a" and "an," unless otherwise indicated to the contrary, include the plural as well as the singular. Thus, for example, the constraint of "a feature" is satisfied where one or more features are present. Also, the term "or" includes the conjunctive, the disjunctive, and both (a or b thus includes either a or b, as well as a and b).

For purposes of a detailed discussion above, embodiments of the present invention are described with reference to a head-mounted display unit; however, the head-mounted display unit depicted herein is merely exemplary. Components can be configured for performing novel aspects of embodiments, where "configured for" comprises programmed to perform particular tasks or implement particular abstract data types using code. Further, while embodiments of the present invention may generally refer to the head-mounted display unit and the schematics described herein, it is understood that the techniques described may be extended to other implementation contexts.

Embodiments of the present invention have been described in relation to particular embodiments which are intended in all respects to be illustrative rather than restrictive. Alternative embodiments will become apparent to those of ordinary skill in the art to which the present invention pertains without departing from its scope.

From the foregoing, it will be seen that this invention in one well adapted to attain all the ends and objects hereinabove set forth together with other advantages which are obvious and which are inherent to the structure.

It will be understood that certain features and sub-combinations are of utility and may be employed without reference to other features or sub-combinations. This is contemplated by and is within the scope of the claims.

The invention claimed is:

1. A computer-implemented method for regulating DC current received from two or more non-collocated batteries within a head-mounted display, the method comprising:
    receiving a first signal describing a first amperage for a first DC current in a first path that is conductively connected to a first battery within the head-mounted display;
    receiving a second signal describing a second amperage for a second DC current in a second path that is conductively connected to a second battery within a head-mounted display;
    determining that an amperage difference between the first amperage and the second amperage is greater than a threshold amperage;
    in response to said determining, sending a signal to a hardware component electrically coupled to the first path with an instruction to add a first amount of resistance to the first path; and
    dynamically adding, by the hardware component, the first amount of resistance in the first path to decrease the first amperage to a first adjusted amperage that is less than the threshold amperage difference from the second amperage.

2. The method of claim 1, wherein the first battery and the second battery are located more than six inches apart.

3. The method of claim 1, wherein the hardware component is a field-effect transistor (FET) associated with the first path, the signal causing the first amount of resistance across the FET.

4. The method of claim 1, wherein the method further comprises storing the amperage difference as an entry in a data store, the entry having a time when the amperage difference was detected.

5. The method of claim 1, wherein the method further comprises:
    calculating a trend of amperage differences between the first path and the second path over time; and
    generating an alarm when the trend indicates an increasing internal resistance across either the first battery or the second battery.

6. The method of claim 1, wherein the first battery is located on a right side of the head-mounted display and the second battery is located on a left side of the head-mounted display.

7. The method of claim 1, wherein the first DC current and the second DC current are supplied by a charging mechanism.

8. The method of claim 1, wherein the amperage difference is determined by a microcontroller.

9. A head-mounted display comprising:
a first battery coupled to a first path serving a load;
a second battery coupled to a second path serving the load; and
a current compensation controller coupled to both the first path and the second path before the first path and the second path connect to the load, the current compensation controller comprising a first current sensor coupled to the first path, a second current sensor coupled to the second path, a first dynamic resistor coupled to the first path, and a second dynamic resistor coupled to the second path, wherein the first dynamic resistor is a field-effect transistor (FET), wherein the current compensation controller comprises a microcontroller programmed to calculate an amperage difference between a first current in the first path and a second current of the second path, and wherein the microcontroller is further programmed to send a signal to the first dynamic resistor with an instruction to add a first amount of resistance to the first path in order to decrease the amperage difference.

10. The head-mounted display of claim 9, wherein the current compensation controller stores the amperage difference as an entry in a data store, the entry having a time when the amperage difference was detected.

11. The head-mounted display of claim 10, wherein the microcontroller is further programmed to regulate a resistance provided by the first dynamic resistor and a resistance provided by the second dynamic resistor to decrease an amperage difference between a first current in the first path and a second current of the second path.

12. The head-mounted display of claim 10, further comprising a data store configured to store amperage difference entries, and wherein the microcontroller is further programmed to generate log entries of amperage differences.

13. The head-mounted display of claim 10, wherein the first battery is located on a right side of the head-mounted display and the second battery is located on a left side of the head-mounted display.

14. The head-mounted display of claim 9, wherein the load is a processor.

15. The head-mounted display of claim 9, wherein the first dynamic resistor is a field-effect transistor (FET).

16. One or more computer storage media having computer-executable instructions embodied thereon that, when executed by a head-mounted display, causes the head-mounted display to perform a method for regulating DC current received from two or more non-collocated batteries within the head-mounted display, the method comprising:
receiving a first signal describing a first amperage for a first DC current in a first path that is conductively connected to a first battery within a head-mounted display, the first path providing power to a processor within the head-mounted display;
receiving a second signal describing a second amperage for a second DC current in a second path that is conductively connected to a second battery within a head-mounted display, the second path providing power to the processor within the head-mounted display;
determining that a difference between the first DC current and the second DC current is greater than a threshold difference; and
in response to said determining, sending a signal to a hardware component electrically coupled to the first path with an instruction to add a first amount of resistance to the first path,
dynamically adding, by the hardware component, a first amount of resistance in the first path to decrease the first DC current to a first adjusted DC current that is less than the threshold difference from the second DC current.

17. The media of claim 16, wherein the first battery is located on a right side of the head-mounted display and the second battery is located on a left side of the head-mounted display.

18. The media of claim 16, wherein the hardware component is a to a field-effect transistor (FET) associated with the first path, the signal causing the first amount of resistance across the FET.

19. The media of claim 16, wherein the method further comprises storing the current difference as an entry in a data store, the entry having a time when the current difference was detected.

20. The media of claim 16, wherein the method further comprises:
calculating a trend of amperage differences between the first path and the second path over time; and
generating an alarm when the trend indicates an increasing internal resistance across either the first battery or the second battery.

* * * * *